(12) United States Patent
Wei

(10) Patent No.: US 6,336,498 B1
(45) Date of Patent: Jan. 8, 2002

(54) LEAF PIECE STRUCTURE FOR HEAT DISSIPATER

(76) Inventor: Wen-Chen Wei, P.O. Box No. 6-57, Chung-Ho City, Taipei Hsien 235 (TW)

( * ) Notice: Subject to any disclaimer, the term of this patent is extended or adjusted under 35 U.S.C. 154(b) by 0 days.

(21) Appl. No.: 09/842,695

(22) Filed: Apr. 27, 2001

(51) Int. Cl.[7] .................................................. H05K 7/20
(52) U.S. Cl. ........................ 165/80.3; 165/185; 361/704
(58) Field of Search .............................. 165/80.3, 185; 361/704, 710; 257/719, 722; 174/16.3

(56) References Cited

U.S. PATENT DOCUMENTS

| | | | | |
|---|---|---|---|---|
| 2,434,676 A | * | 1/1948 | Spender ..................... | 165/80.3 |
| 5,406,451 A | * | 4/1995 | Korinsky .................... | 361/697 |
| 5,518,071 A | * | 5/1996 | Lee ............................. | 165/185 |
| 6,269,002 B1 | * | 7/2001 | Azar ........................... | 361/703 |
| 6,269,003 B1 | * | 7/2001 | Wei ............................ | 361/704 |

* cited by examiner

*Primary Examiner*—Allen Flanigan

(57) ABSTRACT

A leaf piece structure for a heat dissipater is mainly constructed by punch pressing the heat dissipation pieces into heat dissipation poles arranged in a plurality of rows; the dissipation poles are staggered fore and aft in rows with intervals to substantially increase the contact area with the air; the retaining portions are formed by bending the two sides and the bottom end respectively in the same direction; the bottom end is thus defined as a heat conducting piece; the retaining tenons are mounted on the front portions of the retaining slots on the retaining portion to be aligned and retained correspondingly with all the heat dissipation leaves for assembling a heat dissipater.

2 Claims, 4 Drawing Sheets

LEAF PIECE STRUCTURE FOR HEAT DISSIPATER

BACKGROUND OF THE INVENTION

1) Field of the Invention

A leaf piece structure for a heat dissipater, more especially a structure design capable of increasing the surface area and the rate of heat dissipation for accelerating the heat diffusion and lowering the temperature.

2) Description of the Prior Art

In order to solve the overheating problem of the components inside the computer central processing unit, a heat dissipater with heat dissipation fins is usually added to the components of the electronic heat sources, such as the CPU, the IC components, the power chips and the electric source supplier, to enable the high temperature generated by the electronic components to be conducted and diffused into the air through the heat dissipation fins and the surface contacting the air. However, the structure of most of the conventional heat dissipaters comprises heat dissipation pieces (2) mounted on the base plate (1) of the heat dissipater, the base plate (1) is kept in firm contact against the electronic heat generating components to conduct and diffuse the heat generated by the electronic components during operation outwards through the heat dissipation pieces (2). However, this kind of heat dissipater is molded and assembled by compression casting the heat dissipation pieces (2) to be glued to the base plate (1). During assembling, the interval distance between the heat dissipation pieces are larger, therefore the number of the heat dissipation pieces are fewer, the heat dissipation area is thus reduced; furthermore, the strip ribs and the edge frames of these kind of heat dissipation pieces are thicker with more heat accumulation, slower heat conducting rate and limited heat dissipation efficiency for the electronic heat generating components Therefore, the industrial field has developed another assembled heat dissipater, as indicated in FIG. 2. The assembled heat dissipater (3) is formed by punch pressing and mainly comprises of convex protrusions (311) mounted on the male heat dissipation pieces (31) and through holes (321) mounted on the female heat dissipation pieces (32) to be interlocked to form a heat dissipater. Although the heat dissipation pieces of this kind of heat dissipater are thinner, and the number of the heat dissipation pieces and the heat dissipation area is increased, the manufacturing process is time-consuming since the long heat dissipation strips need to be fabricated first, then they are assembled with each other with adapted damper pieces (33), which not only causes material waste, but also requires high cost and is not considered an ideal structure.

In view of the shortcomings of the conventional heat dissipater mentioned above, the inventor sought to improve the structure of the heat dissipation leaves for a heat dissipater not only capable of having greater number heat dissipation and density of fins than what the conventional heat dissipaters have, to not only efficiently increase the heat dissipation area, but also save more material than in conventional heat dissipators, to further lower the cost and obtain the greatest heat dissipation effect, to accelerate the heat dissipation efficiency of the heat source, to improve the function of the hear dissipater and to specifically solve the overheating problems of the components in the computer.

SUMMARY OF THE INVENTION

Therefore, the primary objective of the invention herein is to provide a structure of the heat dissipation leaves through punch pressing and bending the heat dissipation piece to form heat dissipation poles arranged in plurality for substantially increasing the surface area of heat dissipation poles contacting the air in the same volume used so as to accelerate the heat dissipation efficiency.

Another objective of the invention herein is to provide a leaf structure for the heat dissipater through the extended retaining portion bent respectively in the same direction from the two sides and the bottom end of the heat dissipation leaves for the heat dissipation leaves to be aligned and retained correspondingly to assemble a heat dissipater.

Yet another objective of the invention herein is to provide a leaf structure for the heat dissipater, through directly cutting and bending the heat dissipation leaves into a plurality of heat dissipation poles without wasting any materials, but saving the materials, reducing the labor time and lowering the cost.

To enable a further understanding of the objectives, technology, methods and features of the specific structure of the invention herein, the brief description of the drawings below is followed by the detailed description of the preferred embodiment.

DETAILED DESCRIPTION OF THE PREFERRED EMBODIMENTS

Figure 1:
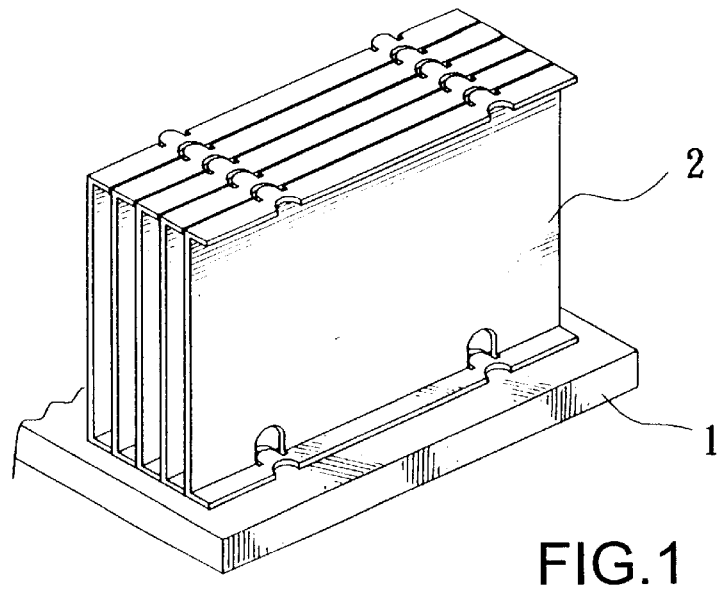
FIG. 1 is a pictorial drawing of the conventional heat dissipater.
Figure 2:
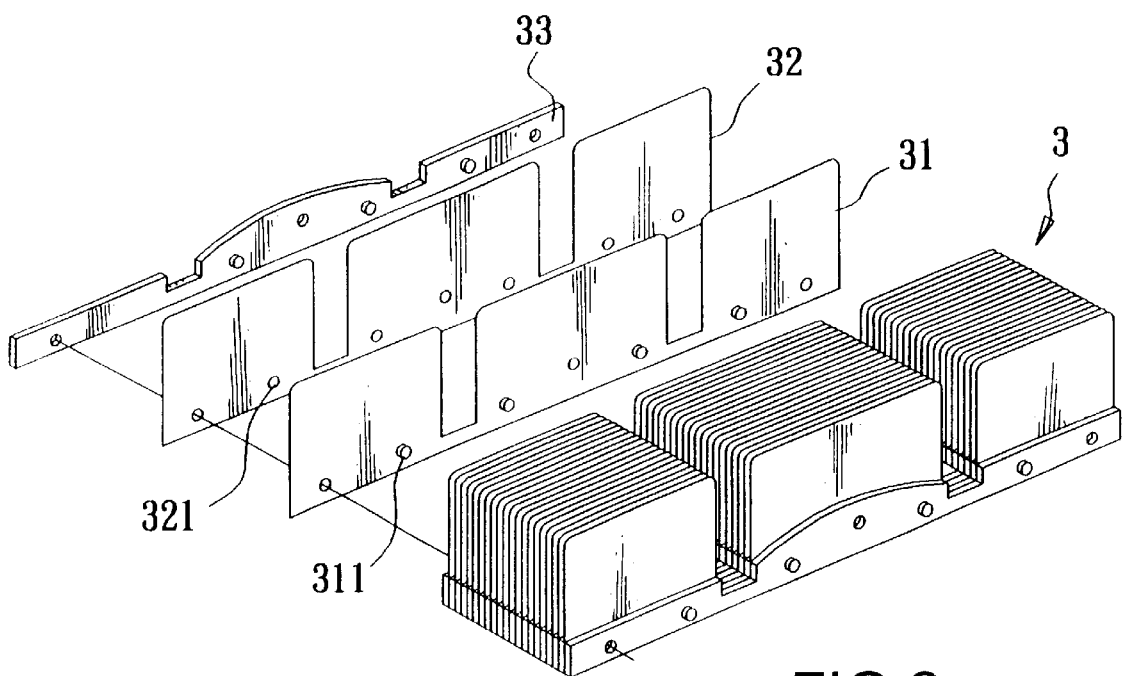
FIG. 2 is a pictorial drawing of another conventional heat dissipater.
Figure 3:
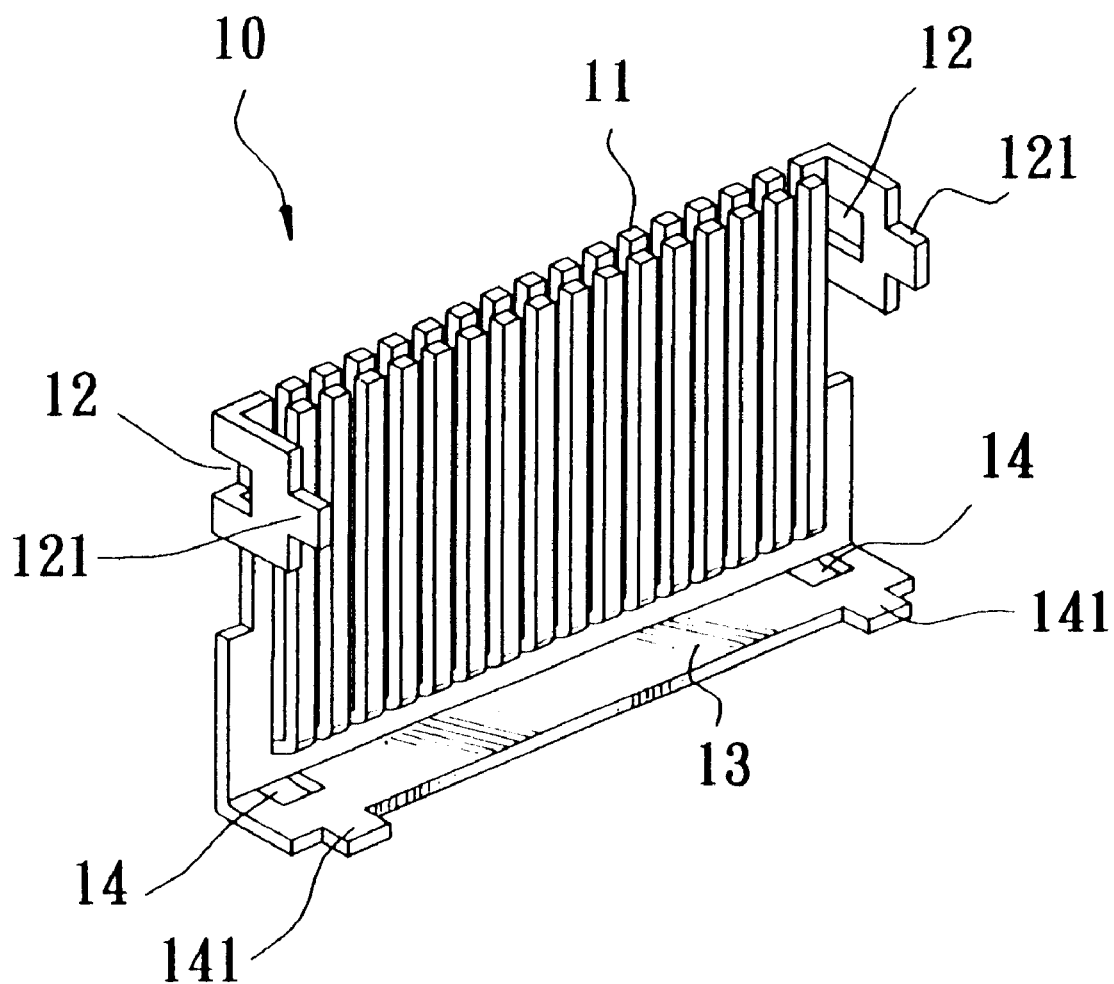
FIG. 3 is a pictorial drawing of the invention herein.

Referring to FIG. 3 of the pictorial drawing of the invention herein, mainly the heat dissipation leaf (10) is punch pressed as a whole to form heat dissipation poles (11) arranged in a plurality of rows; the heat dissipation poles (11) are long, narrow and square columns allowing all four sides of each pole to contact the air and thus to substantially increase the contact area with the air and to strengthen the heat dissipation capacity; furthermore, the heat dissipation poles (11) are bent with intervals and staggered fore and aft in two parallel rows to define more heat dissipation gaps for increasing the free space for the air current, reducing the disturbance of the interfering current and enabling smooth air convection.

The retaining portions mounted with the side retaining slots (12) are formed by bending the two sides of the top ends of the heat dissipation leaves (10); the retaining portions with the bottom retaining slots (14) are formed by bending the bottom ends in the same direction of the side retaining slots (12). The side retaining tenons (121) are disposed at the front ends of the said side retaining slots (12) and the bottom retaining tenons (141) are mounted at the front ends of the said bottom retaining slots (14) for respectively inserting and retaining the side retaining tenons (121) and the bottom retaining tenons (141) with the side retaining slots (12) and the bottom retaining slots (14) and for further aligning and retaining accordingly all the heat dissipation leaves (10) fore and aft to assemble the heat dissipater.

The bottom end of the heat dissipation leaves (10) are also bent to form the heat conducting pieces (13) in the shape of long pieces with flat bottoms to make the bottom portions form compact contact surfaces for beat conduction by combining the heat conducting pieces during assembling for fully absorbing heat from the heat source.

Figure 4:
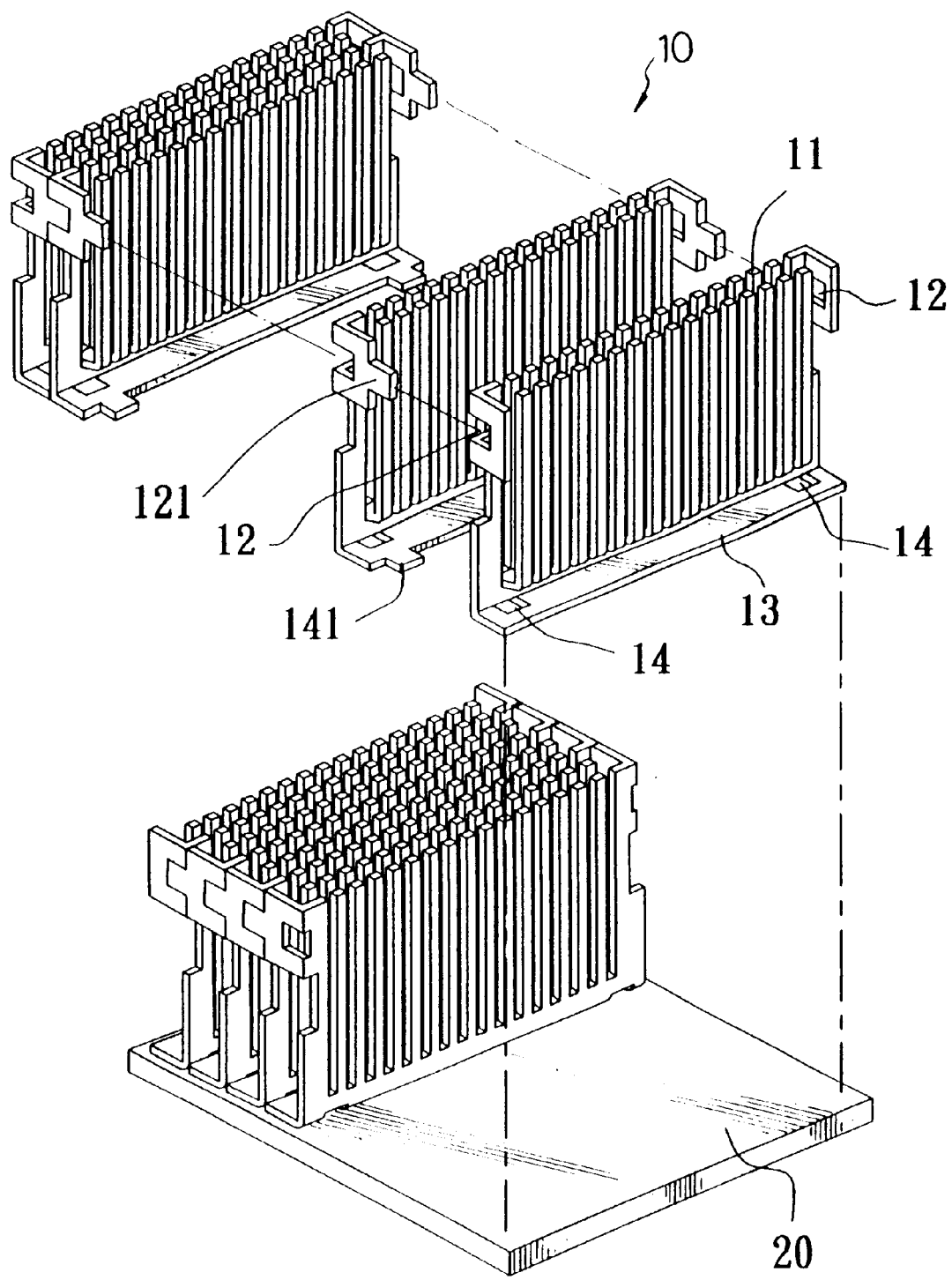
FIG. 4 is a pictorial and isometric drawing of the assembled invention herein.
Figure 5:
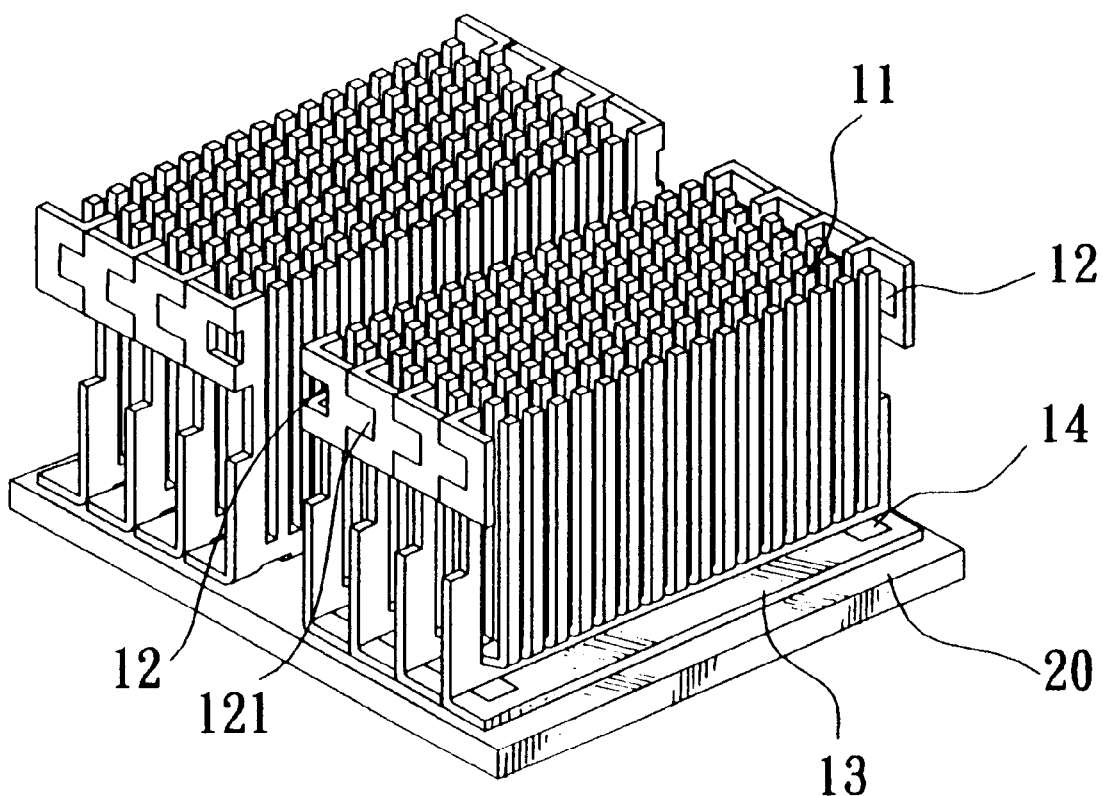
FIG. 5 is a pictorial drawing of the outside view of the assembled invention herein.

Referring to FIGS. 4 and 5 of the pictorial and isometric drawing and the pictorial drawing of the outside view of the assembled invention herein, when assembling, the side retaining tenons (121) on the heat dissipation leaves (10) will be inserted and retained in the side retaining slots (12) of the front heat dissipation leaves; at the same time, the bottom retaining tenons (141) will be inserted and retained respectively in the bottom retaining slots (14) of the front heat dissipation leaves; after inserting and retaining the heat dissipation leaves fore and aft following this order, the assembly will be glued in position onto the heat absorbing base plate (20) to finish the assembly of the heat dissipation leaves of the invention. Since the width of the retaining portion defines a certain interval distance among the heat dissipation leaves (10), and the bent heat dissipation poles (11) are staggered fore and aft in rows, every surface of the all the heat dissipation poles (11) can evenly contact with the air current to enable the entire heat dissipation leaves to fulfill the heat dissipation efficiency and continuously and quickly diffuses the heat. Furthermore, the heat conducting pieces (13) on the bottom ends of the hear dissipation leaves (10) can be constructed with the bottom retaining slots (14) as a unit; after assembling the heat dissipation leaves (10), the bottom portions will form a compact contact surface for heat conduction through the connection and combination of all the heat conducting pieces (13) to substantially increase the contact areas for absorbing heat from the heat source with the heat absorbing base plate (20) and to allow the heat dissipation leaves (10) achieve the best heat conduction and heat dissipation effect.

However, the terminology utilized for the said drawings and components have been selected to facilitate the description of the invention herein and shall not be construed as a limitation on the patented scope of the invention herein; all substitutions of equivalent components based on the spirit of the invention herein shall still be regarded as within the protected scope and of the new patent rights granted to the invention herein.

What is claimed is:

1. A leaf structure for forming a heat sink, comprising:

a plate piece having a top, bottom, and sides, punch pressed to form a plurality of poles, with alternating poles pressed from the plate in an offset manner to form rows of staggered poles separated by intervals;

two bent retaining portions disposed at the upper end of either side of the plate piece defining retaining slots, and retaining tenons extending beyond the retaining slots;

the lower edge of the plate piece being bent along the length thereof to form a heat conducting face, the lower edge also comprising a pair of slots and corresponding tenons disposed at the side of said bent lower edge to define lower retaining portions;

the slots, tenons, and bent lower edge being located and sized such that the tenons and slots of the leaf structure will engage the corresponding slots and tenons of an adjacent leaf structure when stacked together with other leaf structures to form a heat sink.

2. A heat sink comprising a plurality of leaf structures as claimed in claim 1, stacked together such that the corresponding tenons and slots of adjacent leaf structures interfit, and the bent lower edges form a heat conduction surface for attachment to a mounting plate or to a component to be cooled, and the staggered poles of the plates combine to form a matrix of fins.

* * * * *